United States Patent
Uchida et al.

(10) Patent No.: US 9,201,118 B2
(45) Date of Patent: Dec. 1, 2015

(54) CONTROL SYSTEM FOR A BATTERY ASSEMBLY AND CORRESPONDING METHOD OF DETERMINING WHETHER A BATTERY ASSEMBLY CAN BE REUSED

(71) Applicants: Masatoshi Uchida, Toyota (JP);
Yasuhiro Takahashi, Miyoshi (JP);
Koichi Ichikawa, Kasugai (JP);
Masahiko Mitsui, Toyota (JP)

(72) Inventors: Masatoshi Uchida, Toyota (JP);
Yasuhiro Takahashi, Miyoshi (JP);
Koichi Ichikawa, Kasugai (JP);
Masahiko Mitsui, Toyota (JP)

(73) Assignee: TOYOTA JIDOSHA KABUSHIKI KAISHA, Aichi-ken (JP)

( * ) Notice: Subject to any disclaimer, the term of this patent is extended or adjusted under 35 U.S.C. 154(b) by 269 days.

(21) Appl. No.: 13/937,558

(22) Filed: Jul. 9, 2013

(65) Prior Publication Data
US 2014/0015537 A1 Jan. 16, 2014

(30) Foreign Application Priority Data

Jul. 13, 2012 (JP) ................................. 2012-157357

(51) Int. Cl.
*G01N 27/416* (2006.01)
*G01R 31/36* (2006.01)

(52) U.S. Cl.
CPC ........ *G01R 31/3606* (2013.01); *G01R 31/3658* (2013.01); *G01R 31/3679* (2013.01); *Y02W 30/84* (2015.05)

(58) Field of Classification Search
CPC ................... G01R 31/3658; G01R 19/16542; G01R 31/3648; H02J 7/0021; Y02E 60/12
USPC .......................................................... 324/434
See application file for complete search history.

(56) References Cited

U.S. PATENT DOCUMENTS

| | | |
|---|---|---|
| 2002/0000790 A1* | 1/2002 | Sano et al. ..................... 320/162 |
| 2006/0100833 A1* | 5/2006 | Plett ................................ 703/2 |
| 2006/0181245 A1* | 8/2006 | Mizuno et al. ................ 320/132 |
| 2010/0247988 A1* | 9/2010 | Okumura et al. ............... 429/90 |
| 2011/0071781 A1* | 3/2011 | Akahane et al. ................ 702/63 |
| 2011/0084702 A1 | 4/2011 | Mori |
| 2011/0156713 A1* | 6/2011 | Akamine et al. ............. 324/433 |
| 2011/0218703 A1 | 9/2011 | Uchida |
| 2011/0239445 A1 | 10/2011 | Ibi et al. |
| 2013/0200902 A1 | 8/2013 | Kurimoto |

FOREIGN PATENT DOCUMENTS

| | | |
|---|---|---|
| CN | 102043132 A | 5/2011 |
| CN | 102209904 A | 10/2011 |
| JP | 2011-216329 A | 10/2011 |
| WO | 2012/049852 A1 | 4/2012 |

* cited by examiner

*Primary Examiner* — Arun Williams
(74) *Attorney, Agent, or Firm* — Sughrue Mion, PLLC

(57) ABSTRACT

A control system for a battery assembly that consists of a plurality of batteries determines whether the battery assembly can be reused, by using detected values of the open voltage, internal resistance and full charge capacity of each of the batteries, as evaluation parameters.

7 Claims, 9 Drawing Sheets

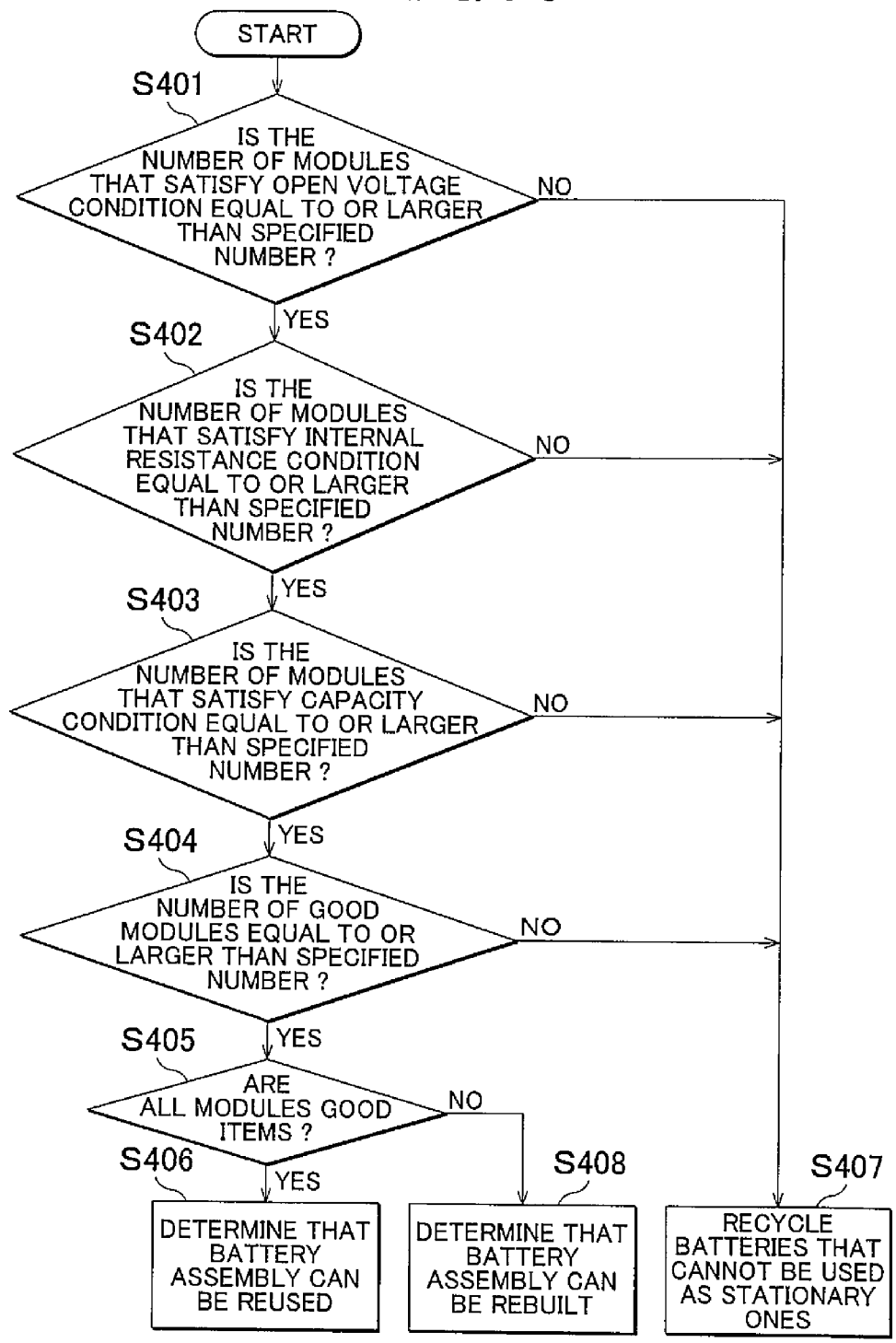

CONTROL SYSTEM FOR A BATTERY ASSEMBLY AND CORRESPONDING METHOD OF DETERMINING WHETHER A BATTERY ASSEMBLY CAN BE REUSED

INCORPORATION BY REFERENCE

The disclosure of Japanese Patent Application No. 2012-157357 filed on Jul. 13, 2012 including the specification, drawings and abstract is incorporated herein by reference in its entirety.

BACKGROUND OF THE INVENTION

1. Field of the Invention

The invention relates to a control system for a battery assembly having a plurality of batteries, and a method of determining reuse of the battery assembly.

2. Description of Related Art

A battery that supplies electric power to a motor for running a vehicle is installed on an electric vehicle, or a hybrid vehicle. The battery deteriorates due to repeated charge and discharge. According to a technology disclosed in Japanese Patent Application Publication No. 2003-007348 (JP 2003-007348 A), for example, the user pays only a deposit for a new battery, and purchases the battery that is in a fully charged state, from a dealer. Then, if the user brings the battery that has been used, to the dealer, the amount of electricity used is calculated at the dealer, based on the remaining capacity of the used battery. The user pays for the calculated amount of electricity used. Then, the used battery recovered from the vehicle is checked for its deterioration level. If it is possible to continue to use the battery, the battery is recharged and sold again at the dealer. If it is not possible to continue to use the battery, the battery is sent from the dealer to a manufacturer where it is recycled.

The dealer determines the deterioration level of the battery, thereby to prevent the battery having a reduced usable life due to its deterioration from being undesirably sold to the user by mistake. In JP 2003-007348 A, the number of times of charging, full charge capacity value, and the number of years for which the battery has been used, are disclosed as evaluation parameters used for evaluating the deterioration level of the battery.

SUMMARY OF THE INVENTION

However, the deterioration level of the battery may not be accurately detected based on the above-described evaluation parameters. Thus, the invention provides a control system that can accurately determine the deterioration level of a battery assembly, and a method of determining reuse of the battery assembly.

A control system according to one aspect of the invention is a control system for a battery assembly having a plurality of batteries, and includes a detector configured to detect an open voltage value of each of the batteries, and a battery assembly diagnostic unit. The battery assembly diagnostic unit is configured to determine whether the battery assembly can be reused, by using the open voltage value, an internal resistance value, and a full charge capacity value of each of the batteries, as evaluation parameters.

In the control system as described above, the battery assembly diagnostic unit may be configured to determine whether the battery assembly can be reused, based on evaluation conditions that associate the evaluation parameters, with the number of the batteries that satisfy criteria of the evaluation parameters. With the battery assembly diagnostic unit thus configured, it can be determined with improved accuracy whether the battery assembly can be reused.

In the control system as described above, the battery assembly diagnostic unit may be configured to classify the batteries into a plurality of classes, based on the evaluation parameters. With the diagnostic unit thus configured, the determination as to whether the battery can be reused, and the evaluation of the respective batteries can be continuously made.

In the control system as described above, the battery assembly may be a battery that stores electric power to be supplied to a motor for running a vehicle, and is recovered after being used in the vehicle. In this case, it can be correctly determined whether the battery that has been installed on the vehicle can be reused.

In the control system as described above, the battery assembly may be reused as it is.

In the control system as described above, the battery assembly may be reused after at least one of the batteries of the battery assembly is replaced with a new battery.

A method of determining whether a battery assembly having a plurality of batteries can be reused according to another aspect of the invention includes the steps of: obtaining an open voltage value of each of the batteries, obtaining an internal resistance value of each of the batteries, obtaining a full charge capacity value of each of the batteries, and determining that the battery assembly can be reused, when conditions i) to iv) as follows are satisfied. The condition i) is that the number of the batteries that satisfy a first criterion concerning the open voltage value is equal to or larger than a first predetermined number, and the condition ii) is that the number of the batteries that satisfy a second criterion concerning the internal resistance value is equal to or larger than a second predetermined number. The condition iii) is that the number of the batteries that satisfy a third criterion concerning the full charge capacity value is equal to or larger than a third predetermined number, and the condition iv) is that the number of the batteries that satisfy all of the first, second and third criteria is equal to or larger than a fourth predetermined number.

According to the invention, the deterioration level of the battery assembly can be accurately determined.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 9 is a flowchart illustrating a method of determining whether a battery assembly is to be rebuilt or reused.

DETAILED DESCRIPTION OF EMBODIMENTS

Figure 1:
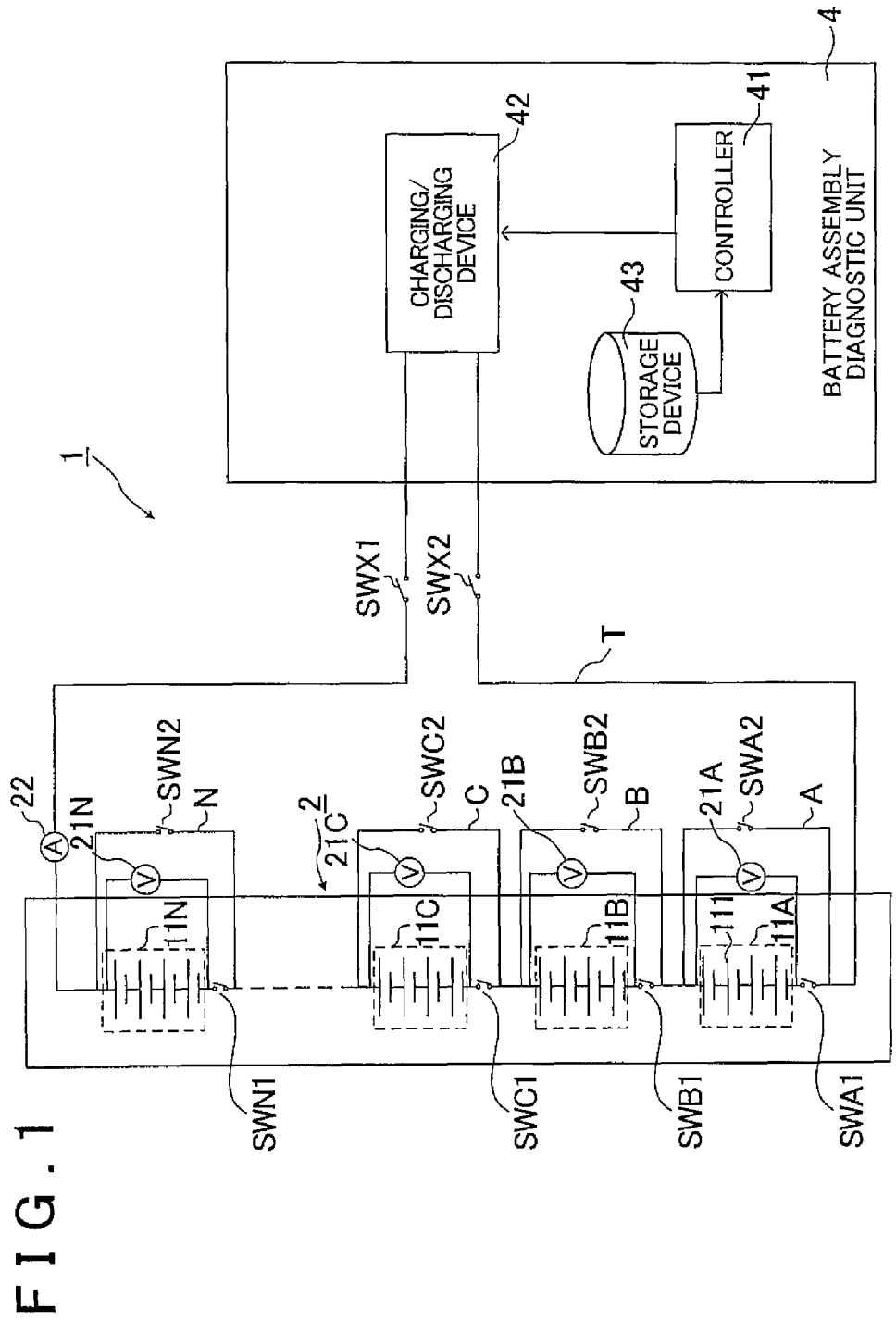
FIG. 1 is a block diagram of a control system.

Referring to FIG. 1, a control system for determining whether a battery assembly can be reused will be described. FIG. 1 is a block diagram showing the control system as one embodiment of the invention. The control system 1 of this embodiment determines whether a used battery assembly 2 that has been used as a battery that stores electric power to be supplied to a motor for running a vehicle can be reused.

The control system 1 includes the battery assembly 2, and a battery assembly diagnostic unit 4. The battery assembly 2 includes a plurality of battery modules (corresponding to batteries) 11A-11N. Each of the battery, modules 11A-11N includes a plurality of cells 111. The battery modules 11A-11N may be connected in series. The number of cells 111 included in each of the battery modules 11A-11N may be equal. The cell 111 may be a secondary cell, such as a lithium-ion cell, or a nickel-metal-hydride cell, or a capacitor.

The battery modules 11A-11N are respectively provided with voltage sensors 21A-21N. Each of the voltage sensors 21A-21N obtains information concerning a voltage value of a corresponding one of the battery modules 11A-11N. A current sensor 22 obtains information concerning a current value representing an electric current delivered from the battery assembly 2.

An end switch SWA1 is provided between the battery module 11A and the battery assembly diagnostic unit 4. Inter-module switches SWB1-SWN1 are provided between adjacent ones of the battery modules 11A-11N. The battery modules 11A-11N are respectively provided with bypass circuits A-N. Each of the bypass circuits A-N is operable to disconnect the corresponding battery module 11A-11N from a connecting circuit that connects the battery assembly 2 with the battery assembly diagnostic unit 4. Bypass switches SWA2-SWN2 are respectively provided in the bypass circuits A-N.

The battery assembly diagnostic unit 4 includes a controller 41, a charging/discharging device 42, and a storage device 43. The battery assembly 2 and the charging/discharging device 42 are connected via a connecting circuit T. Relays SWX1, SWX2 are provided in the connecting circuit T. The controller 41 controls switching operations of the end switch SWA1, inter-module switches SWB1-SWN1, bypass switches SWA2-SWN2, and the relays SWX1, SWX2.

When the end switch SWA1 is turned off, and the bypass switch SWA2 is turned on, the battery module 11A is disconnected from the connecting circuit that connects the battery assembly 2 with the battery assembly diagnostic unit 4, and the bypass circuit A is incorporated into the connecting circuit. When the end switch SWA1 is turned on, and the bypass switch SWA2 is turned off, the bypass circuit A is disconnected from the connecting circuit, and the battery module 11A is incorporated into the connecting circuit. With regard to the other battery modules 11B-11N, too, paths through which current flows can be changed by controlling the switching operations of the inter-module switches SWB1-SWN1 and the bypass switches SWB2-SWN2.

When the relays SWX1, SWX2 are turned on, charge and discharge between the battery assembly 2 and the charging/discharging device 42 are permitted. Namely, electric current is allowed to be discharged from the battery assembly 2 to a load, and the battery assembly 2 is allowed to be charged with current supplied from the charging/discharging device 42. When the relays SWX1, SW2 are turned off, charge and discharge between the battery assembly 2 and the charging/discharging device 42 are inhibited.

The controller 41 obtains an open voltage value, internal resistance value, and a full charge capacity value of each of the battery modules 11A-11N, as evaluation parameters for determining whether the battery assembly 2 can be reused. The controller 41 may be CPU, or MPU, or may include an ASIC circuit that performs at least a part of operations performed by CPU, or the like.

A method of measuring the open voltage value of each of the battery modules 11A-11N will be described. The open voltage values of the battery modules 11A-11N are respectively measured by the voltage sensors 21A-21N. When the open voltage value is measured, an operation to inhibit discharge of each battery module 11A-11N needs to be performed. More specifically, all of the switches provided in the battery assembly diagnostic unit 4, namely, the end switch SWA1, inter-module switches SWB1-SWN1, bypass switches SWA2-SWN2, and the relays SWX1, SWX2 need to be turned off.

Figure 2:
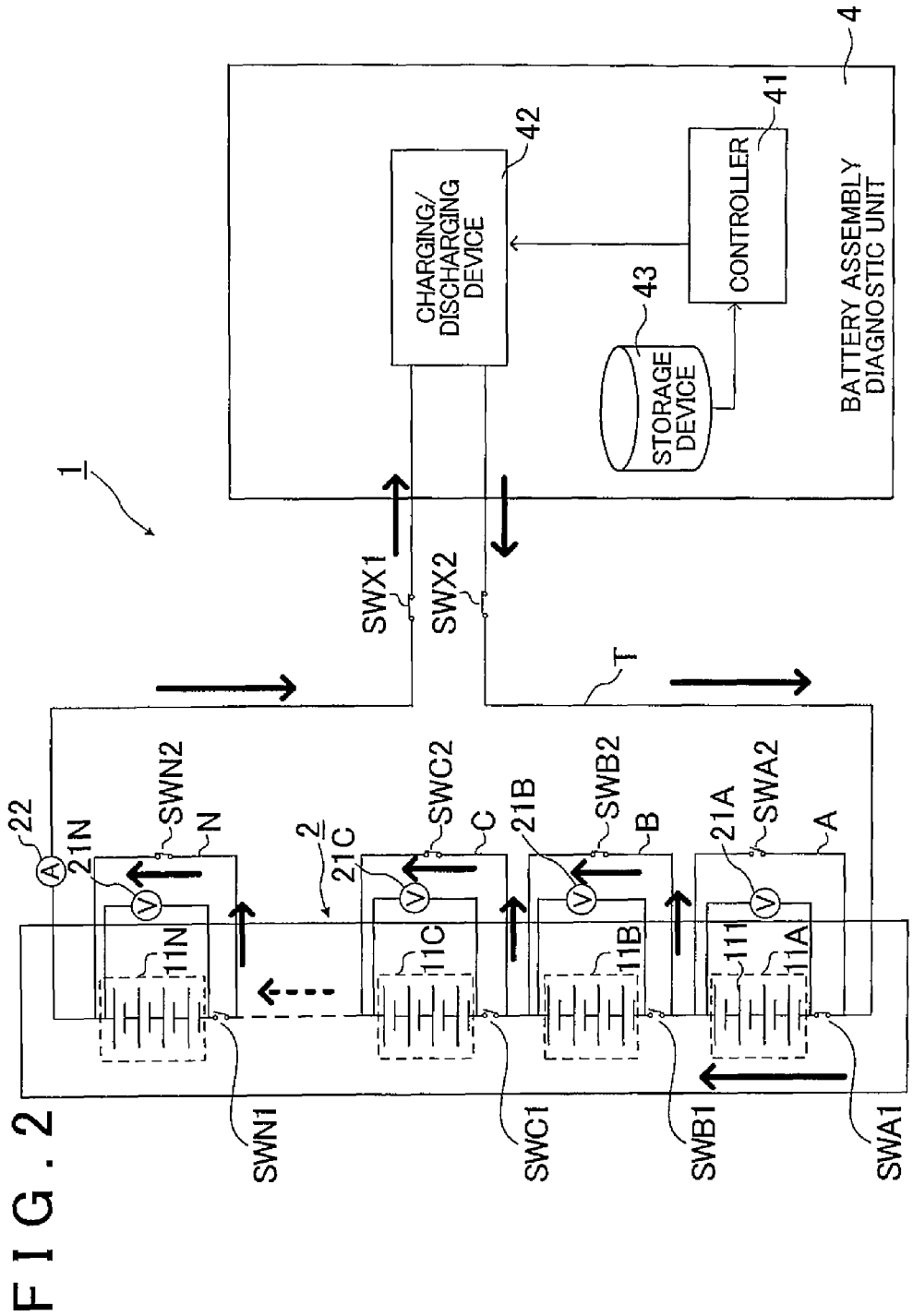
FIG. 2 is a view showing the circuit configuration when an internal resistance value of a battery module 11A is measured.

A method of measuring the internal resistance value of each of the battery modules 11A-11N will be described. As shown in FIG. 2, the end switch SWA1, bypass switches SWB2-SWN2 and the relays SWX1, SWX2 are turned on. In this condition, the battery module 11A is discharged in the direction of arrow, and the voltage value and current value measured by the voltage sensor 21A and current sensor 22 are obtained, so that the internal resistance value of the battery module 11A can be calculated.

Figure 3:
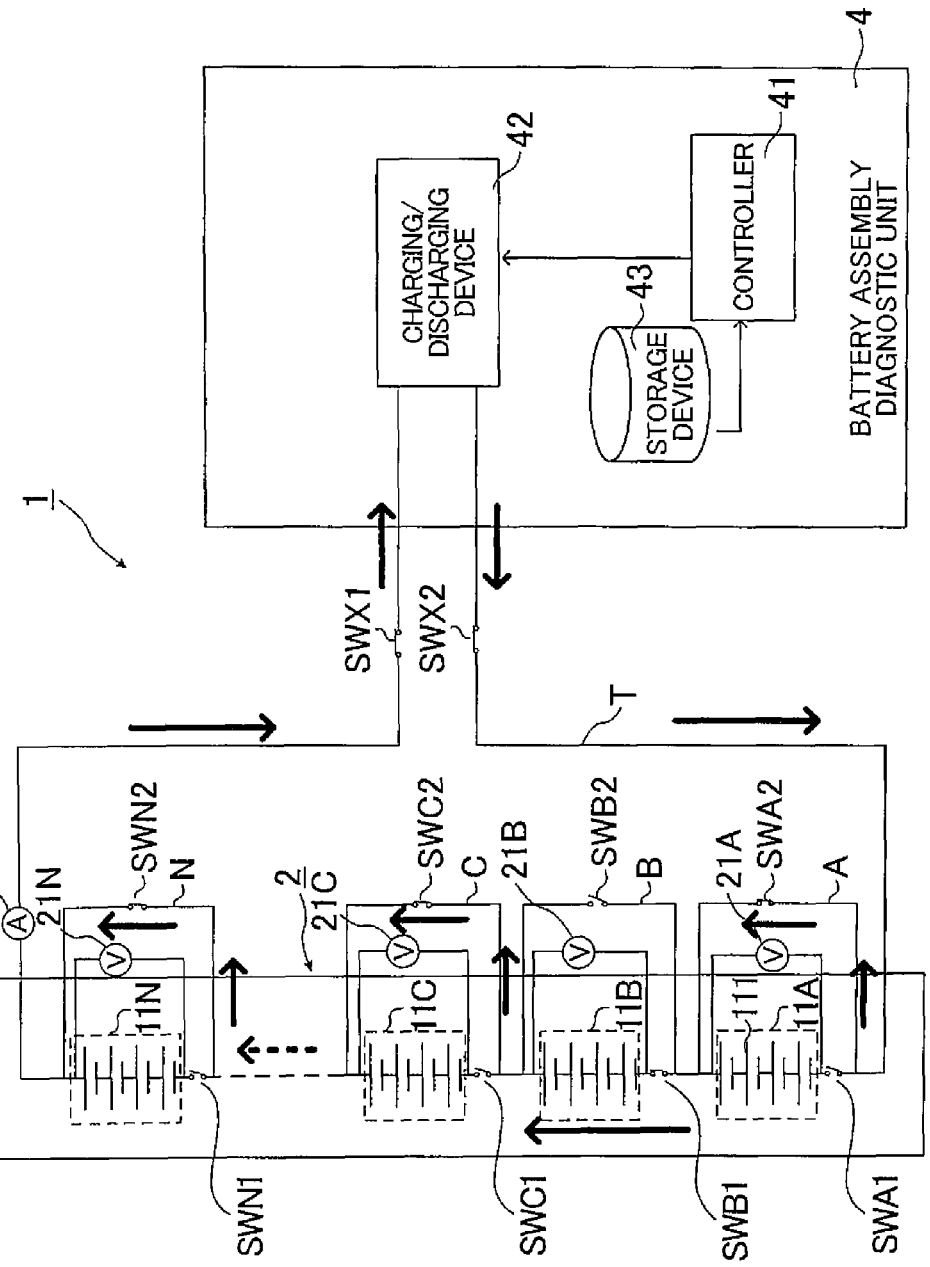
FIG. 3 is a view showing the circuit configuration when an internal resistance value of a battery module 11B is measured.

Also, as shown in FIG. 3, the inter-module switch SWB1, bypass switch SWA2, bypass switches SWC2-SWN2 and the relays SWX1, SWX2 are turned on. In this condition, the battery module 11B is discharged in the direction of arrow, and the voltage value and current value measured by the voltage sensor 21B and current sensor 22 are obtained, so that the internal resistance value of the battery module 11B can be calculated. Methods of measuring the internal resistance values of other battery modules 11C-11N are similar to the above-described methods, and therefore, will not be repeatedly described.

A method of measuring the full charge capacity value of each of the battery modules 11A-11N will be described. The full charge capacity value of the battery module 11A can be calculated from an integrated amount of current obtained when only the battery module 11A, out of the battery modules 11A-11N, is brought into a fully charged state, and only the battery module HA is discharged until its voltage becomes equal to a discharge cutoff voltage.

Figure 4:
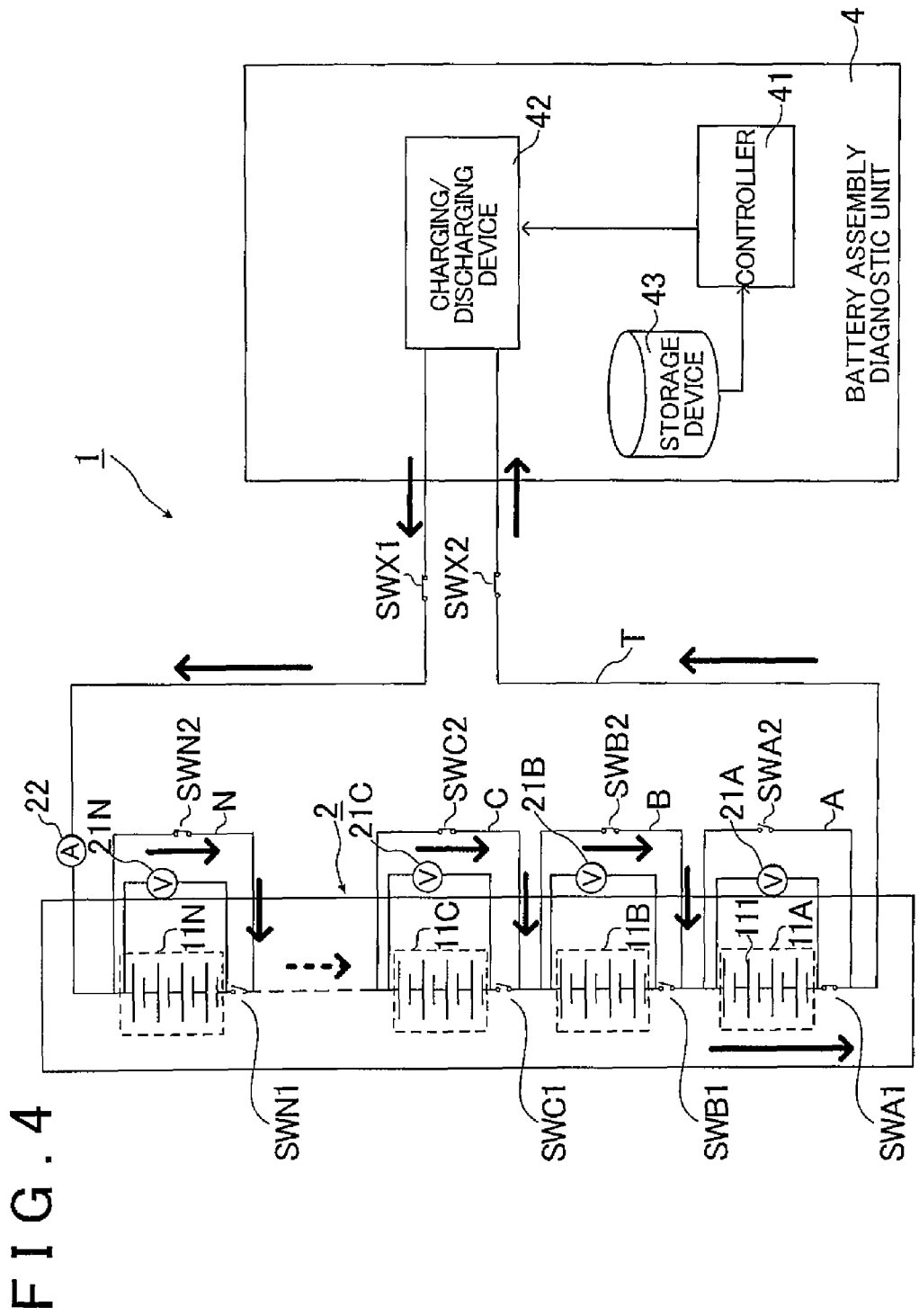
FIG. 4 is a view showing the circuit configuration when only the battery module 11A is charged.

As shown in FIG. 4, the end switch SWA1, bypass switches SWB2-SWN2 (excluding the bypass switch SWA2), and the relays SWX1, SWX2 are turned on, and all of the remaining switches are turned off. In this condition, the charging/discharging device 42 discharges an electric current in the direction of arrow, so that only the battery module 11A, out of the battery modules 11A-11N, can be brought into a fully charged state. Namely, the charging/discharging device 42 continues to perform the charging operation until the voltage value of the battery module 11A detected by the voltage sensor 21A reaches a voltage value corresponding to the fully charged state, so that the battery module 11A can be brought into the fully charged state.

Then, as shown in FIG. 2, the battery module 11A is discharged until its voltage becomes equal to the discharge cut-off voltage, while the voltage value of the battery module 11A is being monitored with the voltage sensor 21A, and the amount of current accumulated during the discharge is calculated, so that the full charge capacity value of the battery module 11A can be measured. Methods of measuring the full charge capacity values of the remaining battery modules 11B-11N are similar to the above-described method, and therefore; will not be repeatedly described.

The storage device 43 stores various information used for determining whether the battery assembly 2 can be used or rebuilt. Details of the various information will be described later. The storage device 43 may be provided by a single storage device, or may be provided by two or more storage devices that work together. As will be described later, the controller 41 determines the number of battery modules included in the battery assembly 2, which modules satisfy certain criteria concerning the open voltage value, internal resistance value and the full charge capacity value, so as to determine whether the battery assembly 2 can be reused or rebuilt.

Figure 5:
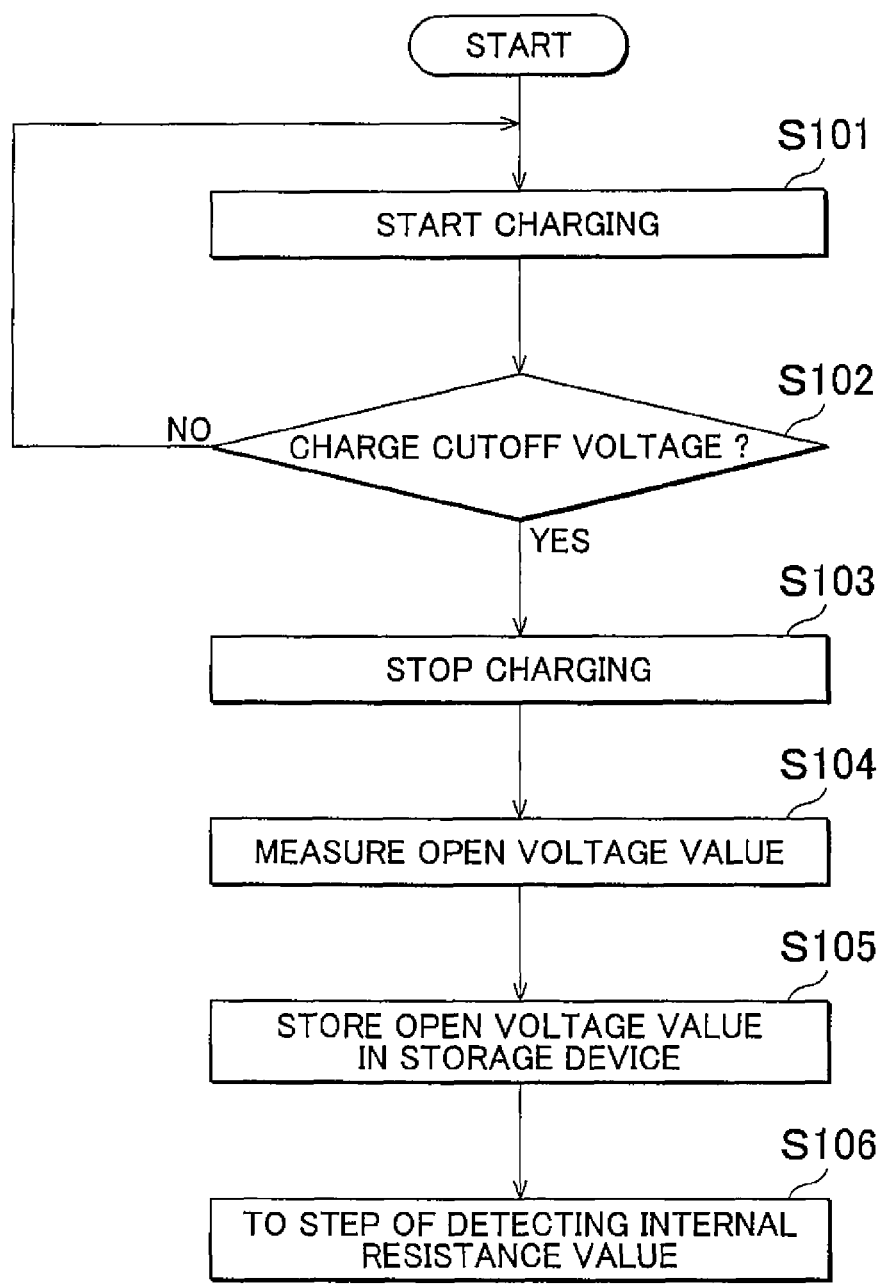
FIG. 5 is a flowchart illustrating a method of measuring an open voltage value.

Referring next to the flowchart of FIG. 5, the method of detecting the open voltage values of the battery modules 11A-11N will be described in greater detail. In the initial condition, the battery assembly 2 and the battery assembly diagnostic unit 4 are connected to each other. In step S101, the controller 41 turns on the relays SWX1, SWX2, end switch SWA1, and the inter-module switches SWB1-SWN1, and controls the charging/discharging device 42, so as to charge the battery assembly 2.

In step S102, the controller 41 determines whether the voltage value of any of the voltage sensors 21A-21N has reached the charge cutoff voltage. If the voltage value of any of the voltage sensors 21A-21N has reached the charge cutoff voltage, the control proceeds to step S103. If none of the voltage values of the voltage sensors 21A-21N has reached the charge cutoff voltage, the control returns to step S101, and charging is continued.

In step S103, the controller 41 turns off the relays SWX1, SWX2, to stop charging, and the control proceeds to step S104. In step S104, the controller 41 measures the open voltage values of the respective battery modules 11A-11N, from the output results of the voltage sensors 21A-21N. In step S105, the controller 41 stores the voltage values detected by the respective voltage sensors 21A-21N, namely, the open voltage values of the respective battery modules 11A-11N, which are associated with the module numbers of the respective battery modules 11A-11N, in the storage device 43. In step S106, the control proceeds to a step of detecting the internal resistance.

Figure 6:
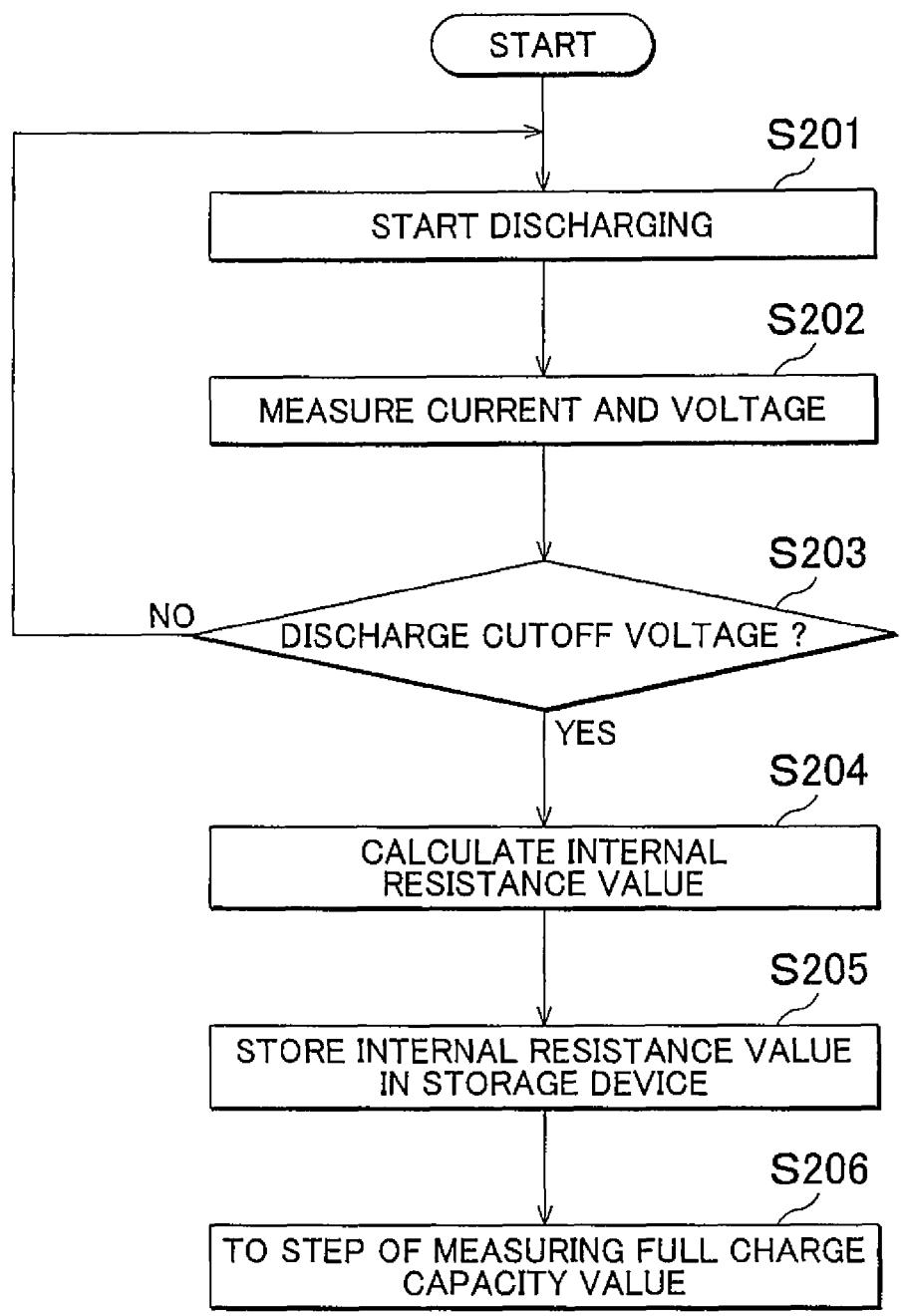
FIG. 6 is a flowchart illustrating a method of measuring an internal resistance value.

Referring to the flowchart of FIG. 6, the method of detecting the internal resistance values of the battery modules 11A-11N will be described in greater detail. In step S201, the controller 41 turns on the relays SWX1, SWX2, the end switch SWA1 and the inter-module switches SWB1-SWN1, so as to discharge the battery assembly 2. In this step, the controller 41 may discharge the battery assembly 2 by gradually increasing the current value.

In step S202, the controller 41 obtains the output results of the current sensor 22 and voltage sensors 21A-21N at given time intervals, and stores the results in the storage device 43. In step S203, the controller 41 determines whether the voltage value of any of the battery modules 11A-11N has fallen down to the discharge cutoff voltage.

If the voltage value of any of the battery modules 11A-11N has fallen down to the discharge cutoff voltage (step S203, YES), the control proceeds to step S204.

If none of the voltage values of the battery modules 11A-11N has fallen down to the discharge cutoff voltage (step S203, NO), the control returns to step S201, and discharging is continued.

Figure 7:
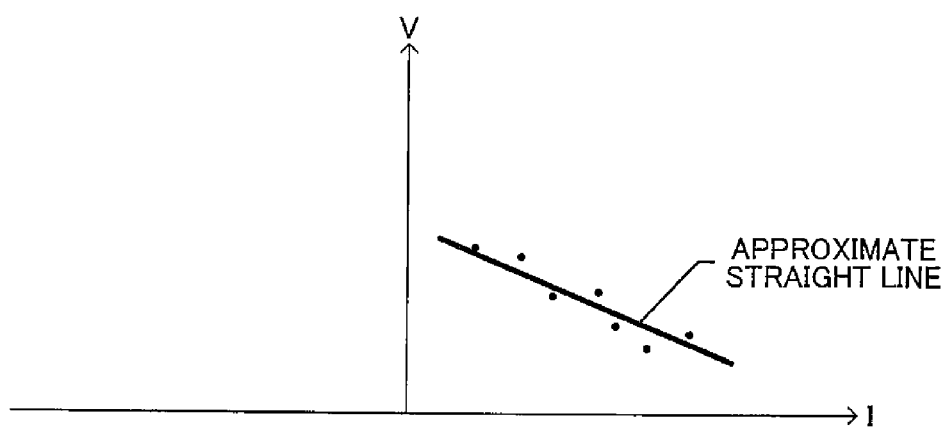
FIG. 7 is a schematic view showing current values and voltage values of the battery module 11 obtained during discharge.

In step S204, the controller 41 calculates the internal resistance value of each of the battery modules 11A-11N, from the current values and voltage values stored in the storage device 43. FIG. 7 schematically shows the current values and voltage values of the battery module 11A obtained during discharge. In FIG. 7, the horizontal axis indicates the current value, and the vertical axis indicates the voltage value. Referring to FIG. 7, the controller 41 may calculate the internal resistance value by defining an approximate straight line, when the voltage values and current values plotted in the graph do not lie on a straight line.

In step S205, the controller 41 stores the calculated internal resistance values, which are associated with the respective module numbers of the battery modules 11A-11N, in the storage device 43. In step S206, the control proceeds to a step of measuring the full charge capacity value.

Figure 8:
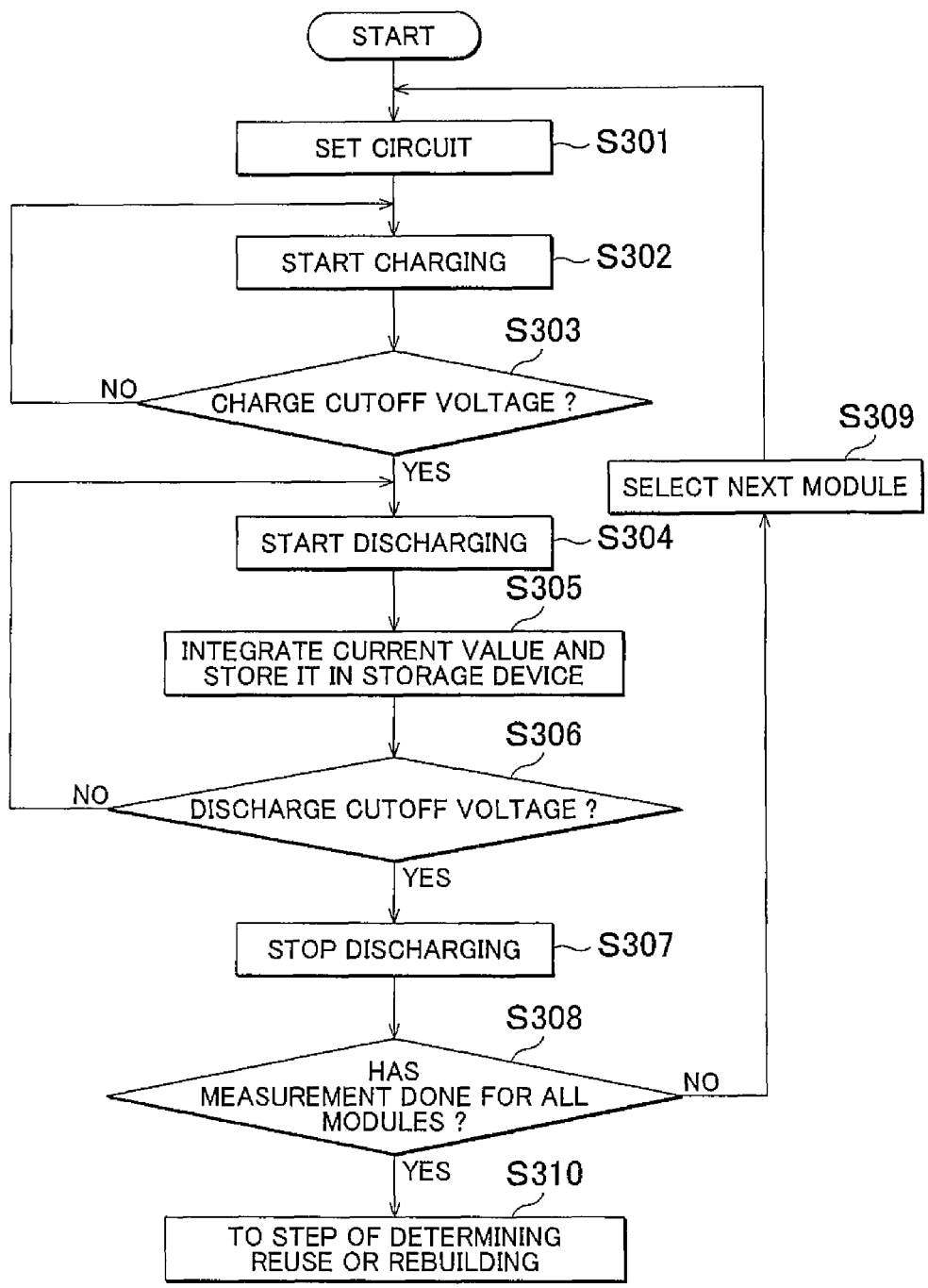
FIG. 8 is a flowchart illustrating a method of measuring a discharge capacity.

Referring to the flowchart of FIG. 8, the method of measuring the full charge capacity value of each of the battery modules 11A-11N will be described in greater detail. In this embodiment, the full charge capacity values are measured in the order of the battery modules 11A-11N. In step S301, the controller 41 operates the end switch SWA1, etc. so as to establish a condition in which only the battery module 11A, out of the battery modules 11A-11N, is charged, namely, set the circuit as illustrated in FIG. 2. It is, however, to be noted that the current flows in a direction opposite to that in the circuit illustrated in FIG. 2.

In step S302, the controller 41 operates the charging/discharging device 42, so as to charge only the battery module 11A. In step S303, the controller 41 determines whether the voltage value of the battery module 11A has reached the charge cutoff voltage. If the voltage value of the battery module 11A has reached the charge cutoff voltage (step S303, YES), the control proceeds to step S304. If the voltage value of the battery module 11A has not reached the charge cutoff voltage (step S303, NO), the control returns to step S302, and charging is continued.

In step S304, the controller 41 switches the operating mode of the charging/discharging device 42 from the charge mode to the discharge mode, and discharges the battery module 11A. In step S305, the controller 41 integrates the current value, based on the output value of the current sensor 22, and stores the integrated amount of current, which is associated with the module number, in the storage device 43. In step S306, the controller 41 determines whether the voltage value of the battery module 11A has fallen down to the discharge cutoff voltage. If the voltage value of the battery module 11A has fallen down to the discharge cutoff voltage (step S306, YES), the control proceeds to step S307. If the voltage value of the battery module 11A has not fallen down to the discharge cutoff voltage (step S306, NO), the control returns to steps S304 and S305, and the current value continues to be integrated while discharging is continued.

In step S307, the controller 41 controls the charging/discharging device 42, so as to stop discharging of the battery module 11A. In step S308, the controller 41 determines whether the integrated amount of current (i.e., the full charge capacity value) has been measured with respect to all of the battery modules 11A-11N. Since the operation to measure the integrated amount of current has not been performed on the battery modules 11B-11N in this cycle of the flowchart, the control proceeds to step S309.

In step S309, the controller 41 selects the next battery module, i.e., the battery module 11B, and returns to step S301. The process of these steps S301-S309 is performed on all of the battery modules. If the integrated amount of current has been measured with respect to all of the battery modules (step S308, YES), the control proceeds to step S310. In step S310, the control proceeds to a reuse/rebuilding determining step.

Referring next to the flowchart of FIG. 9, a method of determining whether the battery assembly 2 can be reused or rebuilt will be described. In step S401, the controller 41 calculates the number of battery modules that satisfy a condition (a first criterion) that the open voltage value is equal to or higher than a predetermined value, based on the detection results obtained in the step of detecting the open voltage value as described above with reference to FIG. 5, and determines whether the calculated number of battery modules is equal to or larger than a specified number (a first predetermined number). Here, the information concerning the "predetermined value" and "specified number" is stored in the storage device 43. The "predetermined value" may be determined as appropriate, based on the permissible degree of deterioration of battery modules, and the "specified number" may be determined as appropriate, depending on the purpose of reuse, for example.

If the number of battery modules that satisfy the condition that the open voltage value is equal to or higher than the predetermined value is equal to or larger than the specified number (step S401, YES), there is a possibility that the battery assembly 2 is a good item, and the control proceeds to step S402. If the number of battery modules that satisfy the condition that the open voltage value is equal to or higher than the predetermined value is smaller than the specified number (step S401, NO), the battery assembly 2 is determined as a defective item, and the control proceeds to step S407.

In step S402, the controller 41 calculates the number of battery modules that satisfy a condition (a second criterion) that the internal resistance value is equal to or lower than a predetermined value is calculated, based on the detection results obtained in the step of detecting the internal resistance value as described above with reference to FIG. 6. Then, the controller 41 determines whether the calculated number of battery modules that satisfy the condition that the internal resistance value is equal to or lower than the predetermined value is equal to or larger than a specified number (a second predetermined number). Here, the information concerning the "predetermined value" and "specified number" is stored in the storage device 43. The "predetermined value" may be determined as appropriate, based on the permissible degree of deterioration of battery modules. The "specified number" may be determined as appropriate, depending on the purpose of reuse, for example.

If the number of battery modules that satisfy the condition that the internal resistance value is equal to or lower than the predetermined value is equal to or larger than the specified number (step S402, YES), there is a possibility that the battery assembly 2 is a good item, and the control proceeds to step S403. If the number of battery modules that satisfy the condition that the internal resistance value is equal to or lower than the predetermined value is smaller than the specified number (step S402, NO), the battery assembly 2 is determined as a defective item, and the control proceeds to step S407.

In step S403, the controller 41 calculates the number of battery modules that satisfy a condition (a third criterion) that the full charge capacity value is equal to or higher than a predetermined value is calculated, based on the measurement results obtained in the step of measuring the full charge capacity as described above with reference to FIG. 8. Then, the controller 41 determines whether the calculated number of battery modules that satisfy the condition that the full charge capacity value is equal to or higher than the predetermined value is equal to or larger than a specified number (a third predetermined number). Here, the information concerning the "predetermined value" and "specified number" is stored in the storage device 43. The "predetermined value" may be determined as appropriate, based on the permissible degree of deterioration of battery modules, and the "specified number" may be determined as appropriate, depending on the purpose of reuse, for example.

If the number of battery modules that satisfy the condition that the full charge capacity value is equal to or higher than the predetermined value is equal to or larger than the specified number (step S403, YES), there is a possibility that the battery assembly 2 is a good item, and the control proceeds to step S404. If the number of battery modules that satisfy the condition that the full charge capacity value is equal to or higher than the predetermined value is smaller than the specified number (step S403, NO), the battery assembly 2 is determined as a defective item, and the control proceeds to step S407.

In step S404, the controller 41 determines whether the number of battery modules that satisfy the above-described first criterion, second criterion and third criterion is equal to or larger than a specified number (a fourth predetermined number). If the number of battery modules that satisfy the first criterion, second criterion and third criterion is equal to or larger than the specified number (step S404, YES), the control proceeds to step S405. If the number of battery modules that satisfy the first criterion, second criterion and third criterion is smaller than the specified number (step S404, NO), the control proceeds to step S407.

In step S405, the controller 41 determines whether all of the battery modules satisfy the first criterion, second criterion and third criterion. If all of the battery modules satisfy the first criterion, second criterion and third criterion, the control proceeds to step S406. If only a part of the battery modules satisfies the first criterion, second criterion and third criterion, the control proceeds to step S408.

In step S406, the controller 41 determines that the battery assembly 2 can be reused. In this case, the battery assembly 2 is reused as it is as a stationary storage battery, for example. Here, the stationary storage battery means a storage battery that is not installed on a moving object, such as a vehicle, but fixed in position. One example of the stationary storage battery is a storage battery that supplies electric power to a household appliance or appliances. The stationary storage battery is charged and discharged with a constant current.

In step S408, the controller 41 determines that the battery assembly 2 can be rebuilt. In this case, defective battery modules as a part of the battery assembly 2 is replaced with new battery modules, so that the battery assembly 2 is reused as a stationary storage battery, for example.

In step S407, the controller 41 determines that the battery assembly 2 should be recycled. In this case, the battery assembly 2 is disassembled, and parts into which the battery assembly 2 is decomposed are used for various purposes. Namely, the battery assembly 2 that can be reused or rebuilt is regarded as being reusable, and the battery assembly 2 that should be recycled is regarded as being non-reusable.

Next, a method of classifying the battery modules included in the battery assembly 2 that is determined as being reusable will be described. Here, the method of classifying the battery modules means classifying the battery modules according to the deterioration level, and one example of the classification is as follows. In the storage device 43, information concerning classification based on the open voltage value, information concerning classification based on the internal resistance value, and information concerning classification based on the full charge capacity value are stored.

The battery modules are classified into A class, B class and C class, based on the open voltage value. The open voltage values of battery modules that belong to A class are higher than those of battery modules that belong to B class, and the open voltage values of battery modules that belong to B class are higher than those of battery modules that belong to C class. The battery modules are classified into A class, B class and C class, based on the internal resistance value. The internal resistance values of battery modules that belong to A class are lower than those of battery modules that belong to B class, and the internal resistance values of battery modules that belong to B class are lower than those of battery modules that belong to C class. The battery modules are classified into A class, B class and C class, based on the full charge capacity value, and the full charge capacity values of battery modules that belong to A class are higher than those of battery modules that belong to B class, and the full charge capacity values of battery modules that belong to B class are higher than those of battery modules that belong to C class.

Here, the controller 41 evaluates a battery module or modules that belong to A class in terms of all of the evaluation items, i.e., the open voltage value, internal resistance value and the full charge capacity value, as "A class". The controller 41 evaluates a battery module or modules that belong to C class in terms of one of the evaluation items, i.e., the open voltage value, internal resistance value and the full charge capacity value, as "C class". The controller 41 evaluates a battery module or modules having other combinations of classes of the evaluation items as "B class" or "C class". The above-described criteria for classification of the battery modules is a mere example, and may be changed as needed by those skilled in the art, according to the purpose of reuse of the battery assembly 2.

While the illustrated embodiment is concerned with the battery assembly that consists of a plurality of battery modules, the invention is not limited to this type of battery assembly, but may be applied to a battery assembly that consists of a plurality of cells, and a method of determining whether the battery assembly consisting of a plurality of cells can be used. Here, the cell means the smallest unit of element that can be charged and discharged.

While a single charging/discharging device 42 is used for obtaining the evaluation parameters of the battery modules 11A-11N in the illustrated embodiment, the invention is not limited to this arrangement. Namely, a charging/discharging device may be provided for each of the battery modules 11A-11N, to be used for obtaining the evaluation parameters.

What is claimed is:

1. A control system for a battery assembly having a plurality battery modules, comprising:
    a charging-discharging device configured to charge or discharge the battery assembly, the charging-discharging device and the battery assembly being connected via a connecting circuit;
    bypass circuits configured to selectively disconnect each of the battery modules from the connecting circuit;
    voltage sensors configured to obtain information concerning voltage values of a corresponding one of the battery modules;
    a current sensor configured to obtain information concerning current value representing an electric current delivered from the battery assembly; and
    a battery assembly diagnostic unit comprising a controller configured to determine whether the battery assembly can be reused by using an open voltage value, an internal resistance value, and a full charge capacity value of each of the battery modules as evaluation parameters, the controller being configured to execute:
    i) charging the battery assembly, stop charging the battery assembly when the voltage value of any of the battery modules reaches a charge cutoff voltage, and measuring the open voltage values of the battery modules,
    ii) discharging the battery assembly, stop discharging the battery assembly when the voltage value of any of the battery modules falls down to a discharge cutoff voltage, and calculating the internal resistance value of each of the battery modules, and
    iii) charging one of the battery modules to the charge cutoff voltage and discharging the one of the battery modules to the discharge cutoff voltage by using one of the bypass circuits, and measuring the full charge capacity value by integrating current value during discharge of the one of the battery modules from the charge cutoff voltage to the discharge cutoff voltage.

2. The control system according to claim 1, wherein the battery assembly diagnostic unit is configured to determine whether the battery assembly can be reused, based on evaluation conditions that associate the evaluation parameters, with the number of the battery modules that satisfy criteria of the evaluation parameters.

3. The control system according to claim 1, wherein the battery assembly diagnostic unit is configured to classify the battery modules into a plurality of classes, based on the evaluation parameters.

4. The control system according to claim 1, wherein the battery assembly comprises a battery module that stores electric power to be supplied to a motor for running a vehicle, and is recovered after being used in the vehicle.

5. The control system according to claim 1, wherein the battery assembly is reused as it is.

6. The control system according to claim 1, wherein the battery assembly is reused after at least one of the battery modules of the battery assembly is replaced with a new battery module.

7. A method of determining, by a control system, whether a battery assembly having a plurality of battery modules can be reused, the control system including a charging-discharging device, bypass circuits, and a controller, the charging-discharging device configured to charge or discharge the battery assembly, the charging-discharging device and the battery assembly being connected via a connecting circuit, the bypass circuits configured to selectively disconnect each of the battery modules from the connecting circuit
    the method, executed by the controller, comprising:
    charging the battery assembly, stop charging the battery assembly when the voltage value of any of the battery modules reaches a charge cutoff voltage, and obtaining an open voltage value of each of the battery modules;
    discharging the battery assembly, stop discharging the battery assembly when the voltage value of any of the battery modules fall down to a discharge cutoff voltage, and obtaining an internal resistance value of each of the battery modules;
    for each battery module, charging the battery module to the charge cutoff value and discharging the battery module to the discharge cutoff voltage by using one of the bypass circuits, and obtaining a full charge capacity value of the battery module by integrating current value during discharge of the battery module from the charge cutoff voltage to the discharge cutoff voltage; and determining that the battery assembly can be reused, when conditions i) to iv) as follows are satisfied, wherein
  i) the number of the battery modules that satisfy a first criterion concerning the open voltage value is equal to or larger than a first predetermined number,
  ii) the number of the battery modules that satisfy a second criterion concerning the internal resistance value is equal to or larger than a second predetermined number,
  iii) the number of the battery modules that satisfy a third criterion concerning the full charge capacity value is equal to or larger than a third predetermined number, and
  iv) the number of the battery modules that satisfy all of the first, second and third criteria is equal to or larger than a fourth predetermined number.

* * * * *